(12) United States Patent
Wang et al.

(10) Patent No.: US 11,018,211 B2
(45) Date of Patent: May 25, 2021

(54) ARRAY SUBSTRATE AND DISPLAY PANE, HAVING SUBPIXELS INCLUDING CORRESPONDING SELF-LUMINOUS UNITS AND PHOTOSENSITIVE UNITS

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/395,730

(22) Filed: Apr. 26, 2019

(65) Prior Publication Data
US 2020/0044004 A1    Feb. 6, 2020

(30) Foreign Application Priority Data
Aug. 2, 2018    (CN) .................. 201810876023.7

(51) Int. Cl.
H01L 27/32    (2006.01)
H01L 51/52    (2006.01)
H01L 51/56    (2006.01)

(52) U.S. Cl.
CPC ........ H01L 27/3269 (2013.01); H01L 27/322 (2013.01); H01L 27/3262 (2013.01); H01L 27/3272 (2013.01); H01L 51/5218 (2013.01); H01L 51/5234 (2013.01); H01L 51/5284 (2013.01); H01L 51/56 (2013.01); H01L 2227/323 (2013.01); H01L 2251/5315 (2013.01)

(58) Field of Classification Search
CPC .............. H01L 27/322; H01L 27/3262; H01L 27/3269; H01L 27/3272; H01L 51/5218; H01L 51/5234; H01L 51/5284
See application file for complete search history.

(56) References Cited

U.S. PATENT DOCUMENTS

| 2003/0151712 | A1  | 8/2003 | Inoue et al. |
| 2010/0133572 | A1  | 6/2010 | Hirai |
| 2011/0074753 | A1* | 3/2011 | Yamamoto ........... G09G 3/3233 345/207 |

(Continued)

FOREIGN PATENT DOCUMENTS

| CN | 1431548 A   | 7/2003 |
| CN | 102034427 A | 4/2011 |

(Continued)

*Primary Examiner* — Matthew E. Gordon
(74) *Attorney, Agent, or Firm* — The Webb Law Firm

(57) ABSTRACT

The embodiment of the present disclosure provides an array substrate, a display panel and a display device. The array substrate comprises a plurality of self-luminous units and photosensitive units disposed on a base substrate, wherein the photosensitive units are located on a side of the self-luminous units proximate to the base substrate, and each of the self-luminous units is correspondingly provided with the photosensitive unit; the self-luminous unit comprises a first electrode, a light-emitting functional layer and a second electrode disposed sequentially in a direction away from the base substrate; the first electrode comprises a light-transmitting region and a reflective region interconnected with each other; the second electrode is a transparent electrode.

16 Claims, 6 Drawing Sheets

(56) References Cited

U.S. PATENT DOCUMENTS

| | | |
|---|---|---|
| 2012/0081495 A1 | 4/2012 | Kubota et al. |
| 2012/0326131 A1 | 12/2012 | Han |
| 2015/0021589 A1 | 1/2015 | Chung et al. |
| 2017/0047383 A1 | 2/2017 | Hsin |
| 2017/0288001 A1 | 10/2017 | Ito |
| 2019/0164493 A1 | 5/2019 | Liu et al. |

FOREIGN PATENT DOCUMENTS

| | | |
|---|---|---|
| CN | 102447073 A | 5/2012 |
| CN | 104659072 A | 5/2015 |
| CN | 107093619 A | 8/2017 |
| CN | 107863065 A | 3/2018 |
| JP | 2017188522 A | 10/2017 |

\* cited by examiner

ARRAY SUBSTRATE AND DISPLAY PANE, HAVING SUBPIXELS INCLUDING CORRESPONDING SELF-LUMINOUS UNITS AND PHOTOSENSITIVE UNITS

CROSS REFERENCE TO RELATED APPLICATIONS

This application claims the priority to Chinese Patent Application No. 201810876023.7 as filed on Aug. 2, 2018, the disclosure of which is incorporated herein in its entirety by reference.

TECHNICAL FIELD

The present disclosure relates to an array substrate, a display panel and a display device.

BACKGROUND

A luminance uniformity of a display image of a display device is an important parameter index for assessing the display device; in particular, for an Organic Light-Emitting Diode (which is called as "OLED") display device, luminance non-uniformity due to process, material, design and the like would result in a decrease in quality of the display image.

SUMMARY

The embodiment of the present disclosure provides an array substrate, a display panel and a display device.

The embodiment of the present disclosure adopts the following technical solutions:

The embodiment of the present disclosure provides an array substrate, comprising a plurality of self-luminous units and photosensitive units disposed on a base substrate, wherein the photosensitive units are located on a side of the self-luminous units proximate to the base substrate, and each of the self-luminous units is correspondingly provided with the photosensitive unit; the self-luminous unit comprises a first electrode, a light-emitting functional layer and a second electrode disposed sequentially in a direction away from the base substrate; the first electrode comprises a light-transmitting region and a reflective region interconnected with each other; the second electrode is a transparent electrode; in the self-luminous unit, the light-transmitting region of the first electrode directly faces a photosensitive portion of the photosensitive unit provided corresponding to the self-luminous unit; among light emitted from the light-emitting functional layer, a light beam incident to the reflective region exits from the second electrode after being reflected, and a light beam incident to the light-transmitting region transmits through the light-transmitting region and are incident to the photosensitive portion of the photosensitive unit for photoelectric induction.

According to embodiments of the present disclosure, different self-luminous units are disposed corresponding to different photosensitive units on a one-to-one basis.

According to embodiments of the present disclosure, the first electrode comprises a transparent sub-electrode and a reflective sub-electrode which are disposed sequentially in a direction away from the base substrate; wherein a region of the reflective sub-electrode configures the reflective region of the first electrode; a projection of the transparent sub-electrode on the base substrate covers a projection of the reflective sub-electrode on the base substrate, the portion of the transparent sub-electrode directly facing the photosensitive portion of the photosensitive unit does not overlap with the reflective sub-electrode, and a non-overlapping region configures the light-transmitting region of the first electrode.

According to embodiments of the present disclosure, the array substrate further comprises a first thin-film transistor and a second thin-film transistor; wherein a source electrode of the first thin-film transistor is connected with the first electrode of the self-luminous unit; a drain electrode of the second thin-film transistor is connected with the photosensitive unit; a gate electrode of the first thin-film transistor and a gate of the second thin-film transistor are on a same layer and have same material, an active layer of the first thin-film transistor and an active layer of the second thin-film transistor are on a same layer and have same material, and a source electrode and a drain electrode of the first thin-film transistor and a source electrode and a drain electrode of the second thin-film transistor are on a same layer and have same material.

According to embodiments of the present disclosure, the self-luminous unit is one of an organic light-emitting diode, a quantum dot light-emitting diode or a micro light-emitting diode.

According to embodiments of the present disclosure, the photosensitive unit comprises a third electrode and a fourth electrode disposed in opposition to each other, and a PIN photodiode located between the third electrode and the fourth electrode; the third electrode is closer to the base substrate than the fourth electrode; the fourth electrode is a transparent electrode and configures the photosensitive portion of the photosensitive unit.

According to embodiments of the present disclosure, the third electrode is connected with the drain electrode of the second thin-film transistor, and the third electrode and the drain electrode of the second thin-film transistor are of an integral structure that are on a same layer and have same material.

In another aspect, the embodiment of the present disclosure provides a display panel, comprising the array substrate as mentioned above.

According to embodiments of the present disclosure, in a case that a light beam emitted from the self-luminous unit is white light, the display panel further comprises a color filter substrate assembled with the array substrate; wherein the color filter substrate comprises a plurality of color filter patterns, and a black matrix surrounding the color filter patterns; the light-transmitting region in the first electrode of the self-luminous unit directly faces the black matrix, and the reflective region in the first electrode of the self-luminous unit directly faces the color filter patterns.

In a further aspect, the embodiment of the present disclosure provides a display device, comprising the display panel as mentioned above.

The embodiment of the present disclosure provides an array substrate, a display panel and a display device. The array substrate comprises a plurality of self-luminous units and photosensitive units disposed on a base substrate, wherein the photosensitive units are located on a side of the self-luminous units proximate to the base substrate, and each of the self-luminous units is correspondingly provided with the photosensitive unit; the self-luminous unit comprises a first electrode, a light-emitting functional layer and a second electrode disposed sequentially in a direction away from the base substrate; the first electrode comprises a light-transmitting region and a reflective region interconnected with each other; the second electrode is a transparent electrode; in the self-luminous unit, the light-transmitting region of the first electrode directly faces a photosensitive portion of the photosensitive unit provided corresponding to the self-luminous unit; among light emitted from the light-emitting functional layer, a light beam incident to the reflective region exits from the second electrode after being reflected, and a light beam incident to the light-transmitting region transmits through the light-transmitting region and are incident to the photosensitive portion of the photosensitive unit for photoelectric induction.

BRIEF DESCRIPTION OF THE DRAWINGS

In order to more clearly illustrate the embodiments of the present disclosure or the technical solutions in the prior art, a brief introduction will be given below for the drawings required to be used in the description of the embodiments or the prior art. It is obvious that, the drawings illustrated below are merely some of the embodiments of the present disclosure. For an ordinary technician in the art, he or she may also obtain other drawings according to these drawings on the premise that no inventive effort is involved.

DETAILED DESCRIPTION

The technical solutions in the embodiments of the present disclosure will be clearly and completely described below with the drawings of the embodiments of the present disclosure. Obviously, the described embodiments are just a part of the embodiments of the present disclosure rather than all of them. All other embodiments that are obtainable to those skilled in the art based on the embodiments of the present disclosure without any inventive effort are included in the protection scope of the present disclosure.

Unless otherwise defined, technological terms or scientific terms used in the embodiments of the present disclosure shall have meanings as commonly understood by those ordinary technicians skilled in the field to which the present disclosure pertains. The terms "first", "second" and similar wordings used in the embodiments of the present disclosure do not mean any order, quantity or importance, but are used only to discriminate different constituents. A term such as "comprising" or "including" means the element or article appearing before said term contain the element or article appearing after said term and equivalents thereof, without exclusion of other elements or articles. A term such as "connected" or "interconnected" and similar wordings does not define a physical or mechanical connection, but may include an electrical connection, either directly or indirectly. Terms such as "up", "down", "left" and "right" are only used to indicate relative positions, and when the absolute position of the described object changes, the relative position may be changed accordingly.

Figure 1:
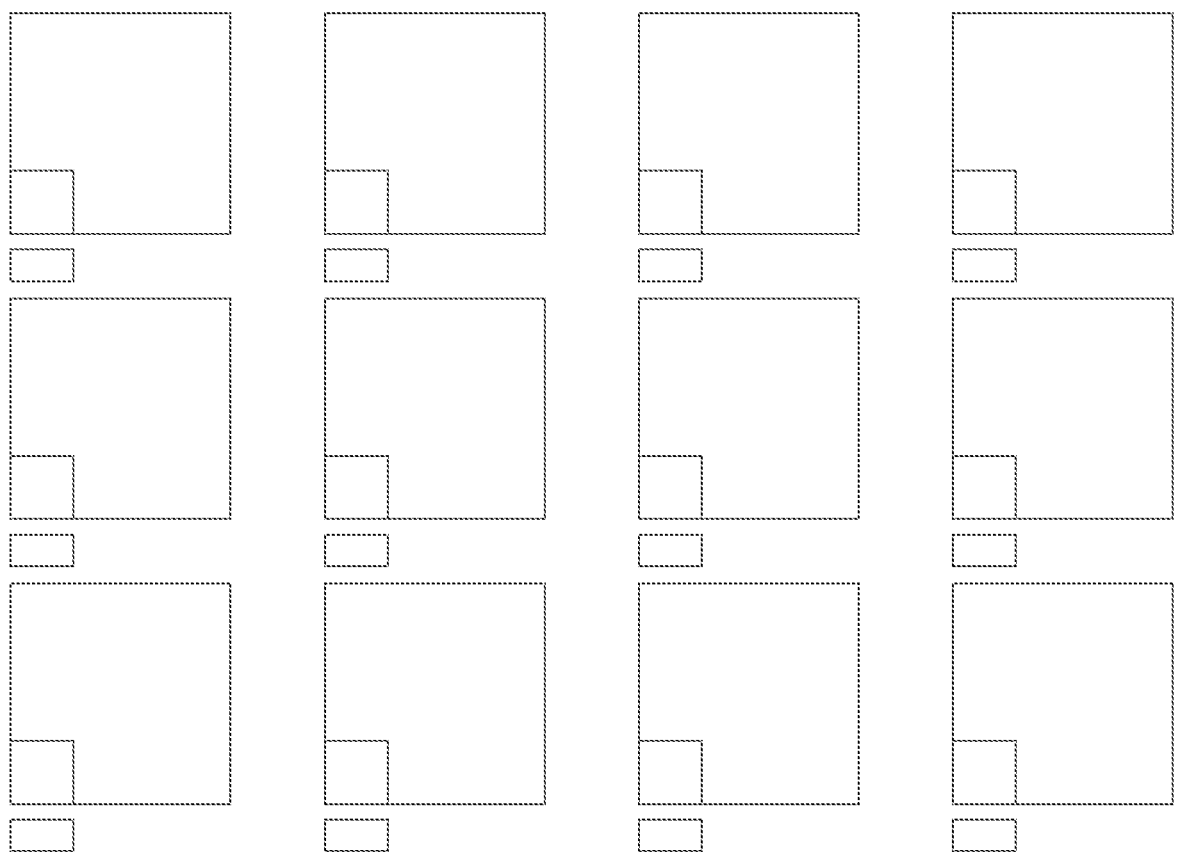
FIG. 1 is a schematic diagram showing a structure of a display panel provided in the prior art.

To overcome the problem of luminance non-uniformity of the display image, in the prior art, as shown in FIG. 1, generally on a cover glass of the display device, a photosensitive unit 200 and a respective controlling transistor TFT are manufactured above the luminous unit corresponding to each of the sub-pixels P, and the luminance of the luminous units in the display device are monitored in real time, such that real-time optical compensation is performed by means of external compensation.

However, the manufacturing of the photosensitive unit 200 and the respective controlling transistor TFT above the luminous unit in the sub-pixel P would decrease an opening rate of the display panel, which would result in disadvantages such as a low light utilization rate of the display panel.

In the array substrate according to the present disclosure, the photosensitive units are disposed on a side of the self-luminous units (top-emitting) proximate to the base substrate, i.e., they are disposed on a back side of the self-luminous units (i.e., on a side opposing the light-emitting side), and a portion of the light beams emitted from the self-luminous units may exit towards the back side so as to be incident to the photosensitive portion of the photosensitive unit for photoelectric induction. In this way, it is able to overcome the problem in the prior art that the opening rate of the display panel is decreased due to arrangement of the photosensitive units on the light-emitting side of the self-luminous units, and at the same time, real-time compensation for the self-luminous units can be satisfied.

Figure 2:
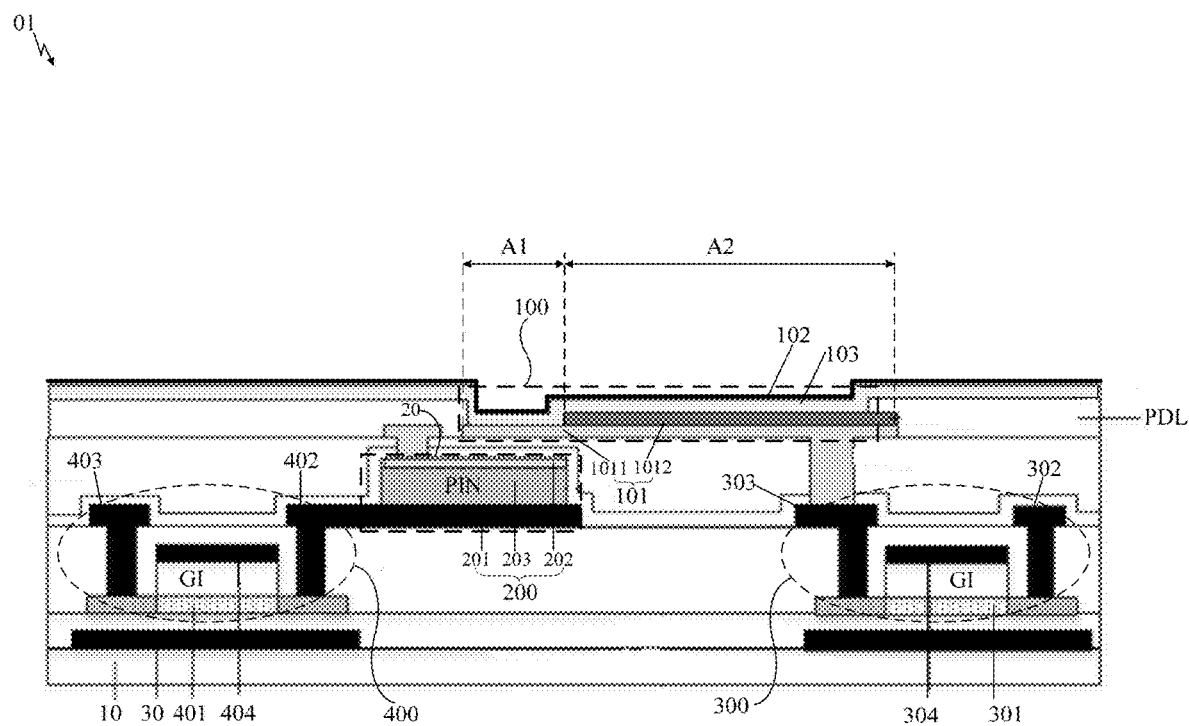
FIG. 2 is a schematic diagram showing a structure of an array substrate provided by the embodiment of the present invention.

The embodiment of the present disclosure provides an array substrate. As shown in FIG. 2, the array substrate 01 comprises a plurality of self-luminous units 100 and photosensitive units 200 disposed on the base substrate 10; wherein the photosensitive units 200 are located on a side of the luminous units 100 proximate to the base substrate 10, and each of the self-luminous unit 100 is correspondingly provided with the photosensitive unit 200.

For example, the self-luminous unit 100 comprises a first electrode 101, a light-emitting functional layer 103 and a second electrode 102 disposed sequentially in a direction away from the base substrate 10; wherein the first electrode 101 comprises a light-transmitting region A1 and a reflective region A2 interconnected with each other; the second electrode 102 is a transparent electrode.

Furthermore, in the self-luminous unit 100, the light-transmitting region A1 of the first electrode 101 directly faces a photosensitive portion 20 of the photosensitive unit 200 provided corresponding to the self-luminous unit 100; among light emitted from the light-emitting functional layer 103, a light beam incident to the reflective region A2 exits from the second electrode 102 after being reflected, and a light beam incident to the light-transmitting region A1 transmits through the light-transmitting region A1 and is incident to the photosensitive portion 20 of the photosensitive unit 200 for photoelectric induction.

It needs to be noted that, in the present disclosure, the wording "directly facing" describes a relative positional relation between two correlated objects. For example, B1 directly facing B2 generally means either a positive projection of B1 completely overlaps with a positive projection of B2, or a projection of B1 falls into a projection of B2.

To sum up, in the self-luminous unit 100 as described above, since the first electrode 101 is closer to the base substrate 10 than the second electrode 102, and a light beam emitted from the light-emitting functional layer 103 exits from the second electrode 102 after being partially reflected by the reflective region A2 in the first electrode 101 for display, it can be understood that the self-luminous unit 100 is of a top-emitting type.

In summary, according to the present disclosure, the photosensitive units are disposed on a side of the self-luminous units (top-emitting) proximate to the base substrate, i.e., they are disposed on a back side of the self-luminous units (i.e., on a side opposing the light-emitting side), and a portion of the light beams emitted from the self-luminous units may exit towards the back side so as to be incident to the photosensitive portion of the photosensitive unit for photoelectric induction. In this way, it is able to overcome the problem in the prior art that the opening rate of the display panel is decreased due to arrangement of the photosensitive units on the light-emitting side of the self-luminous units, thereby facilitating an increase in the resolution of the display panel, and at the same time, real-time compensation for the self-luminous units can be satisfied.

In addition, it shall also be understood here that, in the prior art, the photosensitive units are manufactured on a cover plate and then correspondingly assembled with the array substrate; since there is a distance between the photosensitive units and the self-luminous units, there are the problems that luminance decay and color cast of the self-luminous units when they are lit up cannot be accurately reflected by the photosensitive units. On the contrary, according to the present disclosure, both the photosensitive units and the self-luminous units are integrated onto an array substrate, thereby ensuring that the photosensitive portion of the photosensitive unit and the transparent sub-electrode of the self-luminous unit are in close proximity to each other, which would accurately and effectively reflect luminance decay and color cast of the self-luminous units when they are lit up, thereby improving precision of the compensation and effectively solving the problem of displaying Mura.

The self-luminous unit 100, the photosensitive unit 200 and corresponding arrangement thereof in the present disclosure are further illustrated below.

With respect to the self-luminous unit 100:

In the present disclosure, the self-luminous unit 100 may be an Organic Light Emitting Diode ("OLED"), a Quantum Dot Light Emitting Diode ("QLED"), or a Micro Light Emitting Diode ("Micro LED"). The present disclosure is not specifically limited thereto. According to the embodiments of the present disclosure, the self-luminous unit 100 in the present disclosure is the OLED. The following embodiments further describe the present disclosure by taking this as an example.

It shall be understood herein that in case the self-luminous unit 100 as described above is the OLED, the light-emitting functional layer 103 as described above may substantially include: a hole injection layer, a hole transmission layer, a light-emitting layer, an electronic transmission layer, an electronic injection layer, or the like.

In practical manufacturing, generally, the second electrode 102 of all the OLEDs in the array substrate is set as a whole-layer planar electrode (see FIG. 2); the first electrode 101 is a block electrode located in the subpixels; regarding the light-emitting functional layer 103 of the OLED, according to practical needs, the light-emitting functional layer 103 may be separately disposed corresponding to different first electrodes 101, or the light-emitting functional layer 103 of all the OLEDs may be disposed as a whole-layer planar structure. The present disclosure is not limited thereto.

Of course, it shall be understood herein that in case the light-emitting functional layer 103 of all the OLEDs are disposed as a whole-layer planar structure, an actual effective region of the light-emitting functional layer 103 is at a position in contact with both the first electrode 101 and the second electrode 102 (light is not emitted from a region where the first electrode is not disposed). In addition, the specific position of the light-emitting functional layer 103 is defined by a pixel defining layer (PDL).

Furthermore, it shall also be understood herein that, in case the light-emitting functional layer 103 of all the OLEDs in the array substrate 01 is the whole-layer structure as shown in FIG. 2, generally, a light beam emitted from the light-emitting functional layer 103 is white light (i.e., WOLED); for the arrangement structure of the light-emitting functional layer 103 which is separately disposed for an individual subpixel, the material for the light-emitting layer may be selected according to needs, such that the OLED itself may emit light beams of red, green and blue colors, and of course, may emit white light.

On this basis, the specific arrangement manner of the first electrode 101 as described above is further described below.

As mentioned above, the first electrode 101 comprises a light-transmitting region A1 and a reflective region A2 that are interconnected with each other. In practice, the first electrode 101 is generally provided with a transparent sub-electrode formed with a transparent conductive material (or a transparent thin film formed with a metal material) in the light-transmitting region A1, and a reflective sub-electrode formed with a reflective metal material in the reflective region A2. Of course, in order to facilitate controlling, it shall be ensured that the transparent sub-electrode and the reflective sub-electrode are electrically connected.

On this basis, since the transparent sub-electrode and the reflective sub-electrode are made of different material and are electrically connected with each other, they are generally connected by a manner of an overlapping connection; in practice, in order to ensure smoothness of the reflective sub-electrode with consideration of a decrease in the resistance of the entire first electrode, for example, as shown in FIG. 2, in the first electrode 101, the transparent sub-electrode 1011 may extend below the entire reflective sub-electrode 1012, i.e., a projection of the transparent sub-electrode 1011 on the base substrate 10 covers a projection of the reflective sub-electrode 1012 on the base substrate 10, and a portion of the transparent sub-electrode 1011 directly facing the photosensitive portion 20 of the photosensitive unit 200 (i.e., a portion where the positive projections thereof overlap with each other) does not overlap with the reflective sub-electrode 1012, the non-overlapping region configures the light-transmitting region A1 of the first electrode 101, and the region of the reflective sub-electrode 1012 configures the reflective region of the first electrode 101.

In addition, it shall be understood that, referring to FIG. 2, according to the embodiments of the present disclosure, the transparent sub-electrode 1011 and the reflective sub-electrode 1012 are laminated sequentially in a direction away from the base substrate 10 in order to prevent light beams incident to the reflective sub-electrode 1012 from first entering the transparent sub-electrode 1011 to cause unnecessary light loss.

With respect to the photosensitive unit 200:

The photosensitive unit 200 may comprise: a third electrode 201 and a fourth electrode 202 disposed in opposition to each other, and a PIN photodiode 203 (also called as a PIN photosensitive diode) located between the third electrode 203 and the fourth electrode 202; wherein the third electrode 201 is closer to the base substrate 10 than the fourth electrode 202; the fourth electrode 202 is a transparent electrode which forms the photosensitive portion 20 of the photosensitive unit 200; that is, a light beam transmitting through the transparent sub-electrode 1011 from the self-luminous unit 100 can be directly incident to and transmit through the fourth electrode 202, and be used for a photo-electric induction by the PIN photodiode 203.

It shall be understood herein that the PIN photodiode is generally configured from a P-type semiconductor layer, an intrinsic (I-type) semiconductor layer and an N-type semiconductor layer disposed in a laminated manner.

Figure 3:
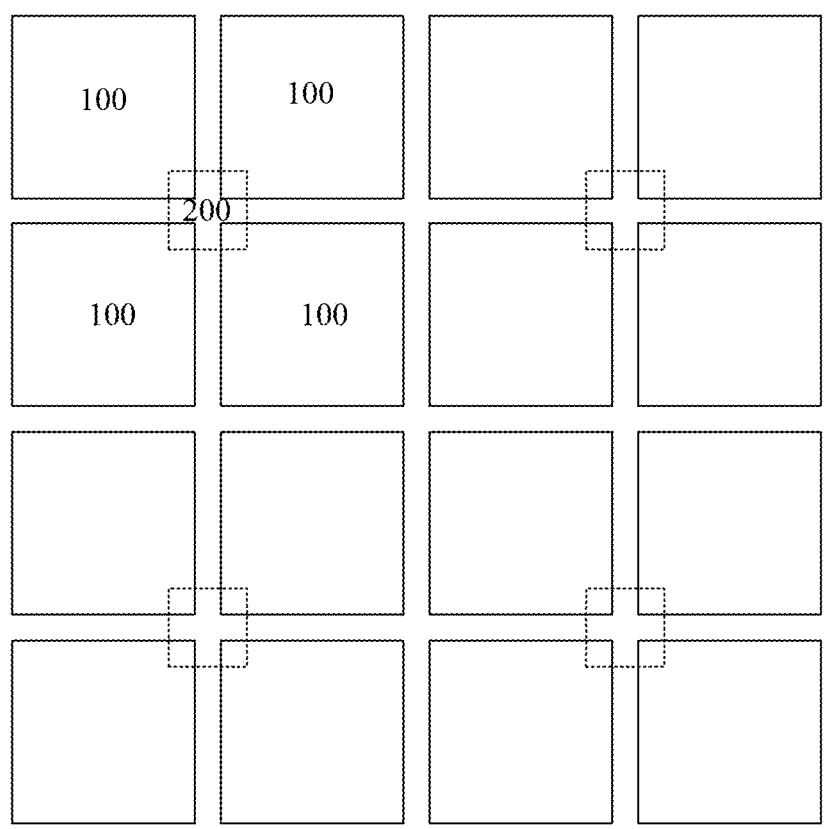
FIG. 3 is a schematic diagram showing a structure of an array substrate provided by the embodiment of the present invention.

In addition, regarding the feature "each of the self-luminous units 100 is correspondingly disposed with the photosensitive unit 200" as mentioned above, one photosensitive unit 200 may correspond to a plurality of self-luminous units 100; illustratively, as shown in FIG. 3, one photosensitive unit 200 corresponds to four neighboring self-luminous units 100, or to two neighboring self-luminous units 100 along a row direction or a column direction. The present disclosure is not specifically limited thereto. It can be understood that in this case, when the photosensitive unit 200 detects luminance of the self-luminous units 100, the plurality of self-luminous units 100 corresponding to this photosensitive unit 200 can be lit up in a time-dividing manner and luminance thereof can be detected in the time-dividing manner. At the same time, it is ensured that only one of the plurality of self-luminous units 100 corresponding to the photosensitive unit 200 is in a lit-up state.

Figure 4:
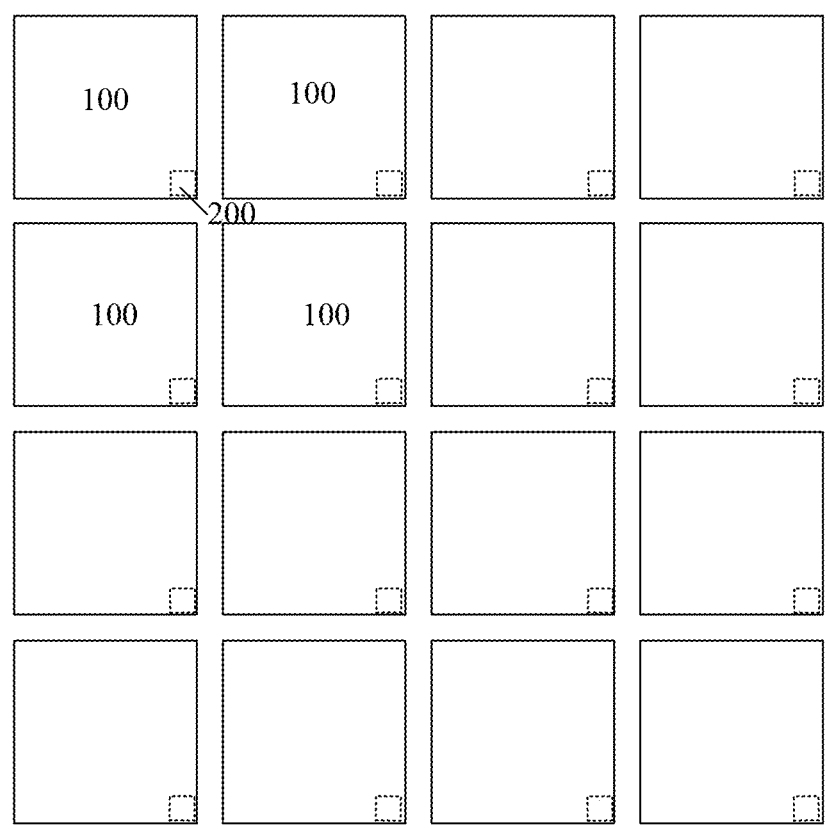
FIG. 4 is a schematic diagram showing a structure of an array substrate provided by the embodiment of the present invention.

Further, as shown in FIG. 4, different self-luminous units 100 are disposed corresponding to different photosensitive units 200 on a one-to-one basis, i.e., one photosensitive unit 200 corresponds to only one self-luminous unit 100 to measure luminance of this self-luminous unit 100. In practice, in order to rapidly and accurately detect luminance of the self-luminance unit in the subpixel, for example, it is possible to employ the manner as shown in FIG. 3 where different self-luminous units 100 are disposed corresponding to different photosensitive units 200. All the following embodiments further describe the present disclosure by taking this as an example.

On this basis, it shall be understood that in practice, in order to control the self-luminous units 100 and the photosensitive units 200, it is generally necessary to provide Thin-Film Transistors (TFTs) for the self-luminous units 100 and the photosensitive units 200, respectively. In the prior art, the thin-film transistor for controlling the self-luminous units 100 is disposed on the base substrate, and the thin-film transistor for controlling the photosensitive units 200 is disposed on the cover plate, which makes the entire manufacturing process complex.

In view of this, in the present disclosure, the self-luminous units 100 are integrated onto the array substrate 01, and at the same time, as shown in FIG. 2, the array substrate 01 comprises: a first thin-film transistor 300 connected with the first electrode 101 of the self-luminous unit 100 to control the self-luminous unit 100; and a second thin-film transistor 400 connected with (the third electrode 201 of) the photosensitive unit 200 to control the photosensitive unit 200. For example, the first electrode 101 of the self-luminous unit 100 is connected with a source electrode 303 of the first thin-film transistor, and the third electrode 201 of the photosensitive unit 200 is connected with a drain electrode 402 of the second thin-film transistor 400.

Meanwhile, an active layer 301 of the first thin-film transistor 300 and an active layer 401 of the second thin-film transistor 400 are on the same layer and have the same material; a drain electrode 302 and a source electrode 303 of the first thin-film transistor 300 and a source electrode 403 and a drain electrode 402 of the second thin-film transistor 400 are on the same layer and have the same material; a gate electrode 304 of the first thin-film transistor 300 and a gate electrode 404 of the second thin-film transistor 400 are on the same layer and have the same material. That is to say, the first thin-film transistor 300 and the second thin-film transistor 400 are manufactured by the same process, or in other words, corresponding components of the first thin-film transistor 300 and the second thin-film transistor 400 are manufactured by the same patterning process, respectively, thereby simplifying the manufacturing process and reducing the manufacturing cost.

The other interlayer structures of the first thin-film transistor 300 and the second thin-film transistor 400 that correspond to one another, such as gate insulating layers (GIs) and light-shielding patterns 30 located at the channel, are also manufactured by the same patterning process.

In addition, in order to simplify the process and reduce the manufacturing cost, the drain electrode 402 of the second thin-film transistor 400 and the third electrode 201 of the photosensitive unit 200 are manufactured by the same process (which may be also called as a patterning process), i.e., the drain electrode 402 of the second thin-film transistor 400 and the third electrode 201 of the photosensitive unit 200 is an integral structure that are on the same layer and have the same material.

It needs to be noted that the patterning process as used in the present disclosure may refer to a process including a photolithography process, or including a photolithography process and an etching step, and also including other processes such as printing, ink-jetting or the like for forming a predetermined pattern; the photolithography process may refer to a process including film-forming, exposing, developing or the like for forming a pattern using a photoresist, a mask, an exposure machine or the like. A corresponding patterning process may be selected according to the structure formed in the present disclosure.

In addition, it shall be understood that FIG. 2 only illustrates a top-gate type of TFT as an example, but the present disclosure is not limited thereto. The first thin-film transistor 300 and the second thin-film transistor 400 as described above may also employ a bottom-gate type of TFTs, TFTs having an etch stop structure (ESL), or TFTs having a back channel etch (BCE) structure. The present disclosure is not specifically limited thereto.

Illustratively, a process for manufacturing the array substrate as shown in FIG. 2 is described simply below.

Figure 5:
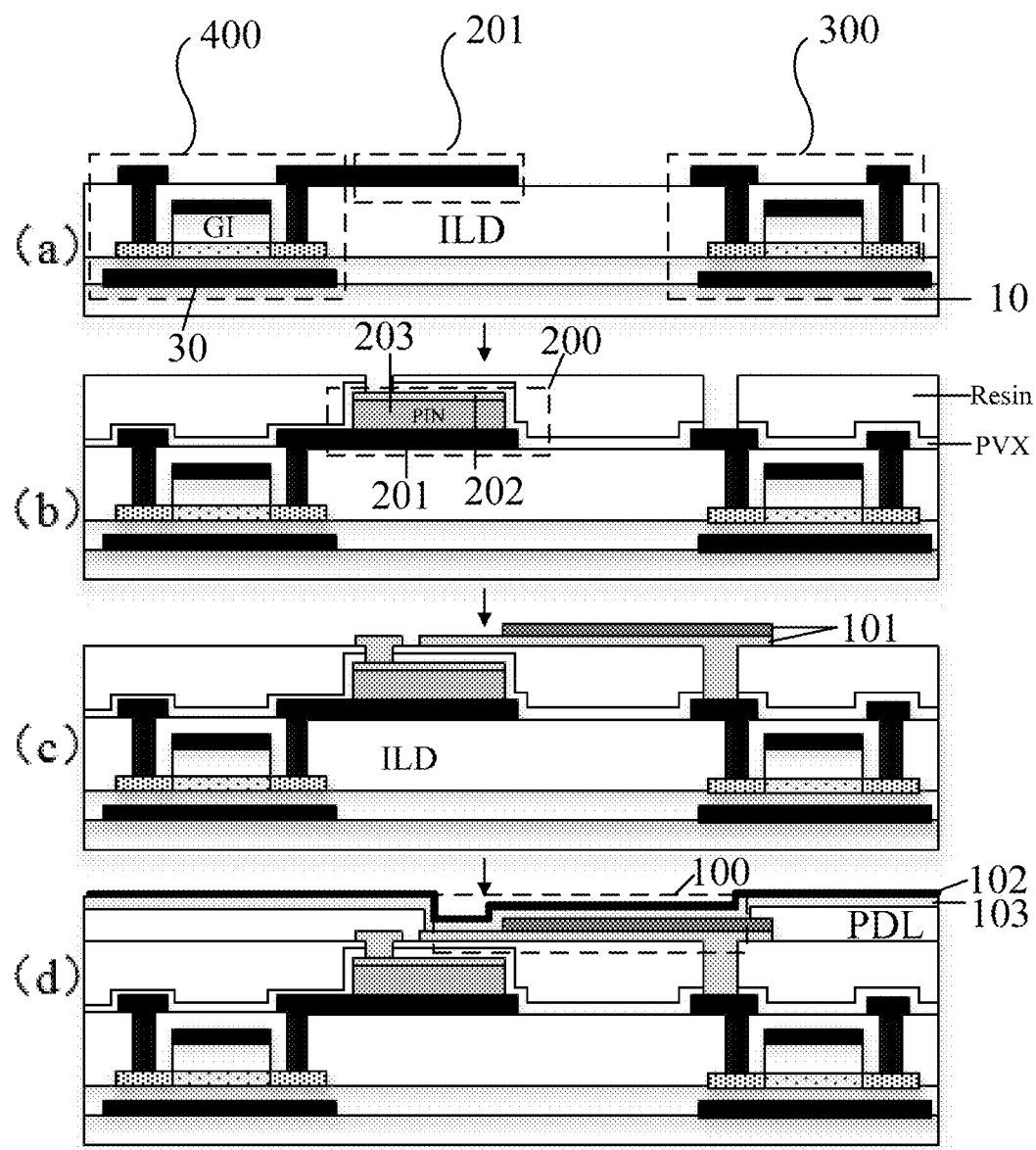
FIG. 5 is a schematic diagram showing a process for manufacturing an array substrate provided by the embodiment of the present invention.

Referring to (a) in FIG. 5, a first thin-film transistor 300 and a second thin-film transistor 400 are first manufactured in the same process on the base substrate 10, and a third electrode 201 of a photosensitive unit 200 is formed at the same time (which is an integral structure with a drain electrode 401 of the second thin-film transistor 400).

Of course, prior to forming the first thin-film transistor 300 and the second thin-film transistor 400, a light-shielding pattern 30 is formed by a sequential patterning process and generally employing a common metal such as Mo, Al, Ti, Au, Cu, Hf, Ta or the like, or an alloy material such as AlNd, MoNd or the like at the channel corresponding to the first thin-film transistor 300 and the second thin-film transistor 400; subsequently, an insulating material such as silicon oxide, silicon nitride, silicon oxynitride or the like is employed to form a buffer layer (Buffer).

The process for forming the first thin-film transistor 300 and the second thin-film transistor 400 includes: sequentially forming an active layer, a gate insulating layer (GI), a gate electrode, an interlayer insulating layer (ILD), a source electrode and a drain electrode patterning layer.

Illustratively, the active layer may be made of a metal oxide material such as an IGZO material, or a material such as a-Si; the gate insulating layer (GI) may be made of an insulating material such as silicon oxide, silicon nitride, silicon oxynitride or the like; the gate electrode may be made of a common metal material such as Mo, Al, Ti, Au, Cu, Hf, Ta or the like, or an alloy material such as MoNd/Cu/MoNd.

Next, referring to (b) in FIG. 5, a PIN photodiode 203 and a fourth electrode 202 of the photosensitive unit 200 are sequentially formed over the base substrate on which the first thin-film transistor 300 and the second thin-film transistor 400 are formed.

For example, PECVD (Plasma Enhanced Chemical Vapor Deposition) may be adopted to sequentially deposit three inorganic (or organic) semiconductor layers of N, I and P (I is an intrinsic semiconductor, N is a phosphor-doped or arsenic-doped semiconductor, and P is a boron-doped semiconductor) and deposit the fourth electrode 202 of an ITO (Indium Tin Oxide) material in order to form the photosensitive unit 200.

Of course, after forming the photosensitive unit 200, referring to (b) in FIG. 5, a passivation layer (PVX) and a planar layer (Resin, which may also be indicated by PLN) (including through-holes at respective positions) are formed in sequence.

Next, referring to (c) in FIG. 5, a first electrode 101 (which may serve as an anode) comprising a transparent sub-electrode 1011 and a reflective sub-electrode 102 or the like are formed in sequence on the planar layer PLB, wherein the first electrode 101 is connected with the drain electrode of the first thin-film transistor 300.

Illustratively, the transparent sub-electrode 1011 may be made of a transparent conductive oxide material such as ITO or the like, or it may be made of a transparent conductive thin film formed from a composite material such as Mg/Al, Ca/Ag, Sm/Ag, Ba/Ag or the like; the reflective sub-electrode 1012 may be made of Ag.

Next, referring to (d) in FIG. 5, after forming the first electrode 101, a pixel defining layer (PDL), a light-emitting functional layer 103 having a whole-layer structure, and a second electrode 102 (which may serve as a cathode) may be formed in sequence to form a self-luminous unit 100 (OLED).

The embodiment of the present disclosure further provides a display panel comprising the array substrate as mentioned above. The display panel comprising the array substrate as mentioned above has the same structure and advantageous effects as the array substrate provided by the above embodiments. Since the above embodiments have described the structure and advantageous effects of the array substrates in details, the description would not be repeated here.

It needs to be noted that in the embodiment of the present disclosure, the display panel, for example, may comprise at least an organic light-emitting diode display panel; for example, the display panel may be applied to any product or component having a display function, such as a display, a television, a digital photo frame, a mobile phone, a tablet computer or the like.

Figure 6:
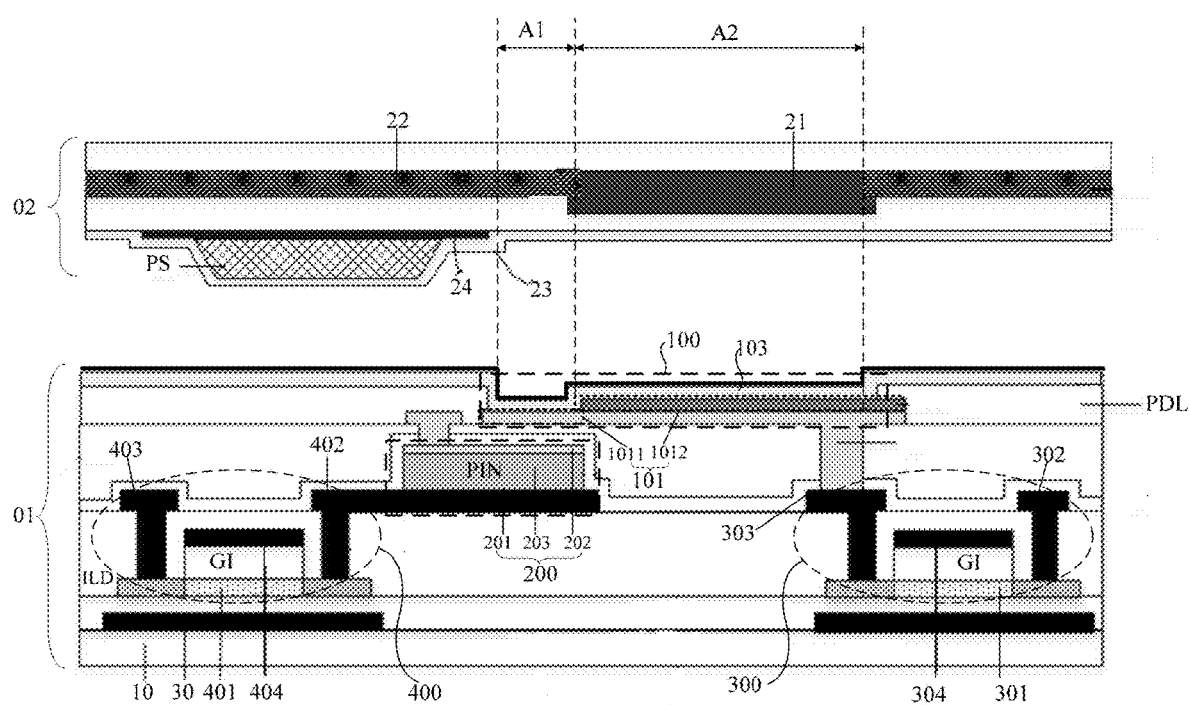
FIG. 6 is a schematic diagram showing a structure of a display panel provided by the embodiment of the present invention.

In addition, it shall be understood herein that, in case the self-luminous unit 100 in the array substrate emits white light (for example, WOLED), the display panel, as shown in FIG. 6, further comprises: a color filter substrate 02 assembled with the array substrate 01.

A plurality of color filter patterns 21 (generally including red color filter patterns, green color filter patterns, and blue color filter patterns), and a black matrix 22 surrounding the color filter patterns 21 are provided on the color filter substrate 01; in practice, generally an effective light-emitting region of the color filter pattern 21 is defined as an opening region of the subpixels (it shall be understood that a region where the color filter pattern 21 overlaps with the black matrix 22 cannot emit light normally and hence does not belong to the opening region).

The reflective region A2 in the first electrode 101 of the self-luminous unit 100 in the array substrate 01 directly faces the color filter pattern 21, while the light-transmitting region A1, according to practical needs, may directly face the black matrix 22, as shown in FIG. 6 (i.e., a positive projection of the light-transmitting region A1 falls into a positive projection of the black matrix 22); of course, it may also be provided that the light-transmitting region A1 directly faces the color filter pattern 21 (i.e., a positive projection of the light-transmitting region A1 falls into a positive projection of the color filter pattern 21). The present disclosure is not specifically limited thereto, and in practice, this may be provided according to practical needs; for example, it may also be provided that a portion of the light-transmitting region A1 directly faces the color filter pattern 21 and the remaining portion of the light-transmitting region A1 directly faces the black matrix 22.

It shall be understood herein that in the array substrate 01, at a position where the light-emitting functional layer 103 contacts the light-transmitting region of the first electrode 101, a light beam as emitted toward a side of the photosensitive portion 20 of the photosensitive unit 200 (i.e., a side of the first electrode) cannot be used for display, while a light beam toward a side of the second electrode 102 can be normally used for display.

For example, in case the light-transmitting region A1 of the first electrode 101 directly faces the color filter pattern 21, among light beams emitted from the light-emitting functional layer 103, light beams toward a side of the second electrode 102 can be normally used for display; however, it can be understood that, regarding the display, within the opening region of the subpixels, a utilization rate of the light beam from the light-emitting functional layer 103 in the light-transmitting region A1 is lower than a utilization rate of the light beam in the reflective region A2.

In case the light-transmitting region A1 of the first electrode 101 directly faces the black matrix 22, among light beams emitted from the light-emitting functional layer 103, light beams toward a side of the second electrode 102 cannot be used for display; in this case, it can be understood that light beams emitted from the light-emitting functional layer 103 toward a side of the second electrode 102 are absorbed by the black matrix at the light-transmitting region A1 and cannot be used for display, but at this time, the reflective region A2 of the first electrode 101 may fill the entire opening region of the subpixel, thereby ensuring a more light-emitting amount of the subpixel and a higher display luminance.

In summary, by comparing said two arrangement manners as described above, it can be understood that, the first arrangement manner does not waste light beams and has a higher utilization rate of light beams than the second arrangement manner, but the second arrangement manner has a higher light-emitting amount at the opening region of the subpixel and thus has a higher energy consumption than the first arrangement manner. Thus, the specific arrangement manner may be selected in practice according to needs.

In addition, as shown in FIG. 6, in addition to the color filter pattern 21 and the black matrix 22, the color filter substrate 02 generally further comprises a spacer (PS) located on a side of the black matrix 21 proximate to the array substrate 01, and a first auxiliary electrode 23 (which may be, for example, an auxiliary cathode) on a side of the spacer (PS) proximate to the array substrate 01, wherein the first auxiliary electrode 23 is generally a whole-layer electrode made of a transparent conductive material (such as AZO, IZO, AZTO or the like). In addition, in order to reduce the resistance, generally a second auxiliary electrode 24 which is mainly made of a metal material and is connected with the first auxiliary electrode 23 is further provided on a side of the spacer (PS) proximate to the black matrix 22. After the color filter substrate 02 is assembled with the array substrate 01, the first auxiliary electrode 23 directly contacts the second electrode 102 in the array substrate 02, thereby reducing the resistance of the electrode while ensuring normal transmission of electrical signals.

The embodiment of the present disclosure further provides a display device comprising a display panel as mentioned above, which also comprises the array substrate as mentioned above and has the same structure and advantageous effects as the array substrate provided by the above embodiments. Since the above embodiments have described the structure and advantageous effects of the array substrates in details, the description would not be repeated here.

The above are only embodiments of the present disclosure, but the protection scope of the present disclosure shall not be limited thereto. Any modification or substitution conceivable to those technicians familiar with the present technical field shall be included in the protection scope of the present disclosure. Therefore, the protection scope of the present disclosure shall be dependent on the protection scope of the claims.

What is claimed is:

1. An array substrate, comprising:
   a plurality of self-luminous units and a plurality of photosensitive units disposed on abase substrate, wherein the plurality of photosensitive units are located on aside of the plurality of self-luminous units proximate to the base substrate, and each of the plurality of self-luminous units is correspondingly provided with a respective one of the plurality of photosensitive units;
   each of the plurality of self-luminous units comprises a first electrode, a light-emitting functional layer, and a second electrode which are disposed sequentially in a direction away from the base substrate; wherein the first electrode comprises a light-transmitting region and a reflective region interconnected with each other; the second electrode is a transparent electrode;
   in each of the plurality of self-luminous units, the light-transmitting region of the first electrode directly faces a photosensitive portion of the respective one of the plurality of photosensitive units, and
   wherein for each of the plurality of self-luminous units;
   among light emitted from the light-emitting functional layer, a light beam incident to the reflective region exits from the second electrode after being reflected, and a light beam incident to the light-transmitting region transmits through the light-transmitting region and is incident to the photosensitive portion of the respective one of the plurality of photosensitive units for photoelectric induction;
   the first electrode comprises a transparent sub-electrode and a reflective sub-electrode which are disposed sequentially in the direction away from the base substrate;
   a region of the reflective sub-electrode serves as the reflective region of the first electrode; and
   a projection of the transparent sub-electrode on the base substrate covers a projection of the reflective sub-electrode on the base substrate, a portion of the transparent sub-electrode directly facing the photosensitive portion of the respective one of the plurality of photosensitive units does not overlap with the reflective sub-electrode, and the portion of the transparent sub-electrode not overlapping with the reflective sub-electrode serves as the light-transmitting region of the first electrode.

2. The array substrate according to claim 1, wherein different self-luminous units are disposed corresponding to different photosensitive units on a one-to-one basis.

3. The array substrate according to claim 1,
   wherein two neighboring self-illuminating units along a row direction are disposed corresponding to same one of the photosensitive units; or
   wherein two neighboring self-illuminating units along a column direction are disposed corresponding to the same one of the photosensitive units; or
   wherein both the two neighboring self-illuminating units along the row direction and the two neighboring self-illuminating units along the column direction are disposed corresponding to the same one of the photosensitive units.

4. The array substrate according to claim 1, wherein the array substrate further comprises a first thin-film transistor and a second thin-film transistor;
   wherein a source electrode of the first thin-film transistor is connected with the first electrode of the self-luminous unit;
   wherein a drain electrode of the second thin-film transistor is connected with the respective one of the plurality of photosensitive units; and
   wherein a gate electrode of the first thin-film transistor and a gate electrode of the second thin-film transistor are on the same layer and have the same material, an active layer of the first thin-film transistor and an active layer of the second thin-film transistor are on the same layer and have the same material, and the source electrode and the drain electrode of the first thin-film transistor and the source electrode and the drain electrode of the second thin-film transistor are on the same layer and have the same material.

5. The array substrate according to claim 1, wherein each of the plurality of self-luminous units is one of an organic light-emitting diode, a quantum dot light-emitting diode, or a micro light-emitting diode.

6. The array substrate according to claim 4, wherein the respective one of the plurality of photosensitive units comprises a third electrode and a fourth electrode disposed in opposition to each other, and a PIN photodiode located between the third electrode and the fourth electrode;
   wherein the third electrode is closer to the base substrate than the fourth electrode; and
   wherein the fourth electrode is a transparent electrode and serves as the photosensitive portion of the respective one of the plurality of photosensitive units.

7. The array substrate according to claim 6, wherein for the respective one of the plurality of photosensitive units, the third electrode is connected with the drain electrode of the second thin-film transistor, and the third electrode and the drain electrode of the second thin-film transistor are of an integral structure that are on the same layer and have the same material.

8. A display panel comprising the array substrate according to claim 1.

9. The display panel according to claim 8, wherein, in a case that a light beam emitted from each of the plurality of self-luminous units is white light, the display panel further comprises a color filter substrate assembled with the array substrate; and wherein the color filter substrate comprises a plurality of color filter patterns, and a black matrix surrounding the plurality of color filter patterns.

10. The display panel according to claim 9, wherein the light-transmitting region in the first electrode of each of the plurality of self-luminous units directly faces the black matrix, and the reflective region in the first electrode of each of the plurality of self-luminous units directly faces the plurality of color filter patterns.

11. The display panel according to claim 9, wherein both the light-transmitting region and the reflective region in the first electrode of each of the plurality of self-luminous units directly face the plurality of color filter patterns.

12. A display device comprising the display panel according to claim 8.

13. A method for manufacturing an array substrate, comprising:

forming a plurality of photosensitive units on a base substrate, each of the plurality of photosensitive units comprises a photosensitive portion;

forming a plurality of self-luminous units on the base substrate so that the plurality of photosensitive units are located on a side of the plurality of self-luminous units proximate to the base substrate, and each of the plurality of self-luminous units is correspondingly provided with a respective one of the plurality of the photosensitive unit;

wherein each of the plurality of self-luminous units comprises a first electrode, a light-emitting functional layer, and a second electrode which are disposed sequentially in a direction away from the base substrate; wherein the first electrode comprises a light-transmitting region and a reflective region interconnected with each other; the second electrode is a transparent electrode; and in each of the plurality of self-luminous units, the light-transmitting region of the first electrode directly faces the photosensitive portion of the respective one of the plurality of photosensitive units, and wherein for each of the plurality of self-luminous units;
among light emitted from the light-emitting functional layer, a light beam incident to the reflective region exits from the second electrode after being reflected, and a light beam incident to the light-transmitting region transmits through the light-transmitting region and are incident to the photosensitive portion of the respective one of the plurality of photosensitive units for photoelectric induction;

the first electrode comprises a transparent sub-electrode and a reflective sub-electrode which are disposed sequentially in the direction away from the base substrate;

a region of the reflective sub-electrode serves as the reflective region of the first electrode; and a projection of the transparent sub-electrode on the base substrate covers a projection of the reflective sub-electrode on the base substrate, a portion of the transparent sub-electrode directly facing the photosensitive portion of the respective one of the plurality of photosensitive unit does not overlap with the reflective sub-electrode, and the portion of the transparent sub-electrode not overlapping with the reflective sub-electrode serves as the light-transmitting region of the first electrode.

14. The method according to claim 13, wherein prior to forming the plurality of photosensitive units on the base substrate, the method further comprises:

forming a first thin-film transistor and a second thin-film transistor on the base substrate;

wherein a source electrode of the first thin-film transistor is connected with the first electrode of a respective one of the plurality of self-luminous units;

wherein a drain electrode of the second thin-film transistor is connected with the respective one of the plurality of photosensitive units; and wherein a gate electrode of the first thin-film transistor and the gate electrode of the second thin-film transistor are on the same layer and have the same material, an active layer of the first thin-film transistor and an active layer of the second thin-film transistor are on the same layer and have the same material, and the source electrode and the drain electrode of the first thin-film transistor and the source electrode and the drain electrode of the second thin-film transistor are on the same layer and have the same material.

15. The method according to claim 14, wherein the respective one of the plurality of photosensitive units comprises a third electrode and a fourth electrode disposed in opposition to each other, and a PIN photodiode located between the third electrode and the fourth electrode;

wherein the third electrode is closer to the base substrate than the fourth electrode; and wherein the fourth electrode is a transparent electrode and forms the photosensitive portion of the respective one of the plurality of photosensitive units.

16. The method according to claim 15, wherein the third electrode is connected with the drain electrode of the second thin-film transistor, and the third electrode and the drain electrode of the second thin-film transistor are of an integral structure that are on the same layer and have the same material.

* * * * *

UNITED STATES PATENT AND TRADEMARK OFFICE
CERTIFICATE OF CORRECTION

PATENT NO. : 11,018,211 B2  
APPLICATION NO. : 16/395730  
DATED : May 25, 2021  
INVENTOR(S) : Guoying Wang et al.

It is certified that error appears in the above-identified patent and that said Letters Patent is hereby corrected as shown below:

On the Title Page

Column 1, Title, Line 1, delete "PANE," and insert -- PANEL --

In the Specification

Column 1, Line 1, delete "PANE," and insert -- PANEL --

In the Claims

Column 11, Line 42, Claim 1, delete "abase" and insert -- a base --

Column 11, Line 44, Claim 1, delete "aside" and insert -- a side --

Column 11, Line 59, Claim 1, delete "units;" and insert -- units: --

Column 13, Line 51, Claim 13, delete "units;" and insert -- units: --

Column 14, Line 14, Claim 13, delete "unit" and insert -- units --

Signed and Sealed this  
Seventeenth Day of August, 2021

Drew Hirshfeld  
*Performing the Functions and Duties of the*  
*Under Secretary of Commerce for Intellectual Property and*  
*Director of the United States Patent and Trademark Office*